(12) United States Patent
Lius et al.

(10) Patent No.: US 11,869,883 B2
(45) Date of Patent: *Jan. 9, 2024

(54) FLEXIBLE ELECTRONIC ASSEMBLY

(71) Applicant: InnoLux Corporation, Miao-Li County (TW)

(72) Inventors: Chandra Lius, Miao-Li County (TW); Yuan-Lin Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/845,969

(22) Filed: Jun. 21, 2022

(65) Prior Publication Data

US 2022/0320067 A1    Oct. 6, 2022

Related U.S. Application Data

(63) Continuation of application No. 16/931,417, filed on Jul. 16, 2020, now Pat. No. 11,387,228, which is a
(Continued)

(51) Int. Cl.
| | |
|---|---|
| *G02F 1/1333* | (2006.01) |
| *H01L 27/01* | (2006.01) |
| *H10K 50/844* | (2023.01) |
| *H10K 59/00* | (2023.01) |
| *H10K 77/10* | (2023.01) |
| *H01L 27/02* | (2006.01) |
| *H01L 27/12* | (2006.01) |

(Continued)

(52) U.S. Cl.
CPC .......... *H01L 27/016* (2013.01); *G02F 1/1343* (2013.01); *G02F 1/1347* (2013.01); *G02F 1/13306* (2013.01); *G02F 1/133305* (2013.01); *G02F 1/133308* (2013.01); *G02F 1/1533* (2013.01); *H01L 27/0218* (2013.01); *H01L 27/1251* (2013.01); *H01L 29/0653* (2013.01); *H01L 29/41733* (2013.01); *H01L 29/786* (2013.01); *H10K 50/8445* (2023.02); *H10K 59/00* (2023.02); *H10K 77/111* (2023.02); *C09K 2323/00* (2020.08); *C09K 2323/03* (2020.08); *G09F 9/301* (2013.01); *H10K 59/12* (2023.02); *H10K 2102/311* (2023.02)

(58) Field of Classification Search
CPC ... H01L 27/016; H01L 27/32; H01L 51/5256; H01L 51/0097; H01L 2251/5338; G02F 1/133305; G02F 1/133308; G02F 1/1533; G02F 1/1347; G02F 9/30; C09K 2323/00; C09K 2323/03
USPC ...... 428/1.1, 1.3; 359/485.06, 485.09, 489.1, 359/489.11, 506; 349/64, 95, 112
See application file for complete search history.

(56) References Cited

U.S. PATENT DOCUMENTS

| | | | |
|---|---|---|---|
| 10,748,888 B2 * | 8/2020 | Lius | ............... H01L 27/1251 |
| 11,387,228 B2 * | 7/2022 | Lius | ............... H01L 51/5256 |

* cited by examiner

*Primary Examiner* — Ruiyun Zhang
(74) *Attorney, Agent, or Firm* — Winston Hsu

(57) ABSTRACT

A flexible electronic assembly includes an electronic component, a flexible substrate and a supporting layer. The flexible substrate includes a first surface coupled to the electronic component and a second surface opposite to the first surface. The supporting layer is coupled to the second surface, and the supporting layer includes a plurality of protrusions. In a plan view of the flexible electronic assembly, one of the plurality of protrusions includes at least a rounded corner.

8 Claims, 9 Drawing Sheets

Related U.S. Application Data continuation of application No. 15/645,018, filed on Jul. 10, 2017, now Pat. No. 10,748,888.

(60) Provisional application No. 62/450,106, filed on Jan. 25, 2017.

(51) Int. Cl.
| | |
|---|---|
| *H01L 29/06* | (2006.01) |
| *H01L 29/417* | (2006.01) |
| *H01L 29/786* | (2006.01) |
| *G02F 1/133* | (2006.01) |
| *G02F 1/1343* | (2006.01) |
| *G02F 1/1347* | (2006.01) |
| *G02F 1/153* | (2006.01) |
| *G09F 9/30* | (2006.01) |
| *H10K 59/12* | (2023.01) |
| *H10K 102/00* | (2023.01) |

FLEXIBLE ELECTRONIC ASSEMBLY

CROSS REFERENCE TO RELATED APPLICATIONS

This application is a continuation application of U.S. application Ser. No. 16/931,417, filed on Jul. 16, 2020, which is a continuation application of U.S. application Ser. No. 15/645,018, filed on Jul. 10, 2017, which claims the benefit of U.S. Provisional Application No. 62/450,106, filed on Jan. 25, 2017. The contents of these applications are incorporated herein by reference.

BACKGROUND OF THE DISCLOSURE

1. Field of the Disclosure

The present disclosure relates to a display assembly or an electronic assembly, more particularly, to a flexible display assembly or a flexible electronic assembly providing flexibility or support.

2. Description of the Prior Art

Flat panel displays, such as liquid crystal display (LCD), micro light-emitting diode (LED) display, organic light-emitting diode (OLED) display, and electroluminescent display (ELD), are information viewing technologies for widespread use in a variety of electronic apparatus, as the characteristics of thinness, light weight and low dissipation power are widely recognized. These flat panel displays, generally, manufactured and sold today is mounted on rigid glass substrates. Glass substrates can be processed at high temperatures, provide a surface made very smooth and uniform even over large areas, and have desirable optical properties such as high transparency. Although these features are suitable for the manufacture of certain flat panel displays, the rigidness of glass restricts applications of displays configured on non-planar or rugged surfaces and is subject to easy breakage.

As demand for showing information on the diverse surfaces of electronic apparatus is recently increasing, it would be desirable, for many applications, to have flexible or foldable displays that can be bent to a radius of curvature of centimeters without losing functionality. Use of flexible substrates, such as resin, to simply replace glass substrate with a flat panel display is an approach to achieve the flexibility. The flexible substrates can enable or improve the production of flat panel displays and make these displays to conform to any desired shape, so as to substantially broaden their applications.

However, despite the above-mentioned advantages of flexible substrates, a new challenge appears. The flexible substrates are vulnerable to external force, such as scratch and friction. Therefore, there remains a need for improving flexible flat panel displays that ameliorate or eliminate the problem of the flexible substrate.

SUMMARY OF THE DISCLOSURE

The present disclosure provides a display assembly and an electronic assembly providing flexibility or support. In accordance with one aspect of the present disclosure, the flexible electronic assembly includes an electronic component, a flexible substrate and a supporting layer. The flexible substrate includes a first surface coupled to the electronic component and a second surface opposite to the first surface. The supporting layer is coupled to the second surface, and the supporting layer includes a plurality of protrusions. In a plan view of the flexible electronic assembly, one of the plurality of protrusions includes at least a rounded corner.

In accordance with another aspect of the present disclosure, the display assembly comprises a display component and a flexible stratum. The flexible stratum includes a first side coupled to the display component and a second side opposite to the first side. In addition, on the second side, the flexible stratum includes protruding portions separate apart from each other, and one of the protruding portions includes a side section, a top section, and a tapering section extending from the side section to the top section and having a curved surface.

In accordance with another aspect of the present disclosure, the display assembly comprises a display component, a flexible substrate, and a supporting layer. The flexible substrate including a first surface coupled to the display component and a second surface opposite to the first surface. The supporting layer coupled to the second surface, the supporting layer including protruding portions spacing apart from each other, and one of the protruding portions includes a side section, a top section, and a tapering section extending from the side section to the top section and having a curved surface The display assembly according to the present application is capable of employing a variety of displays, and substantially enables the display more flexible to be bent or roll. In addition, the present disclosure provides supporting strength to displays.

It is to be understood that both the foregoing general description and the following detailed description are exemplary and explanatory and are intended to provide further explanation of the disclosures as claimed.

BRIEF DESCRIPTION OF THE DRAWINGS

The accompanying drawings are presented to aid in the description of embodiments of the disclosure and are provided solely for illustration of the embodiments and not limitation thereof

DETAILED DESCRIPTION

Aspects of the disclosure are disclosed in the following description and related drawings directed to specific embodiments of the disclosure. Alternate embodiments may be devised without departing from the scope of the disclosure. Additionally, well-known elements of the disclosure will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments of the disclosure" does not require that all embodiments of the disclosure include the discussed feature, advantage or mode of operation.

In this disclosure, the word "couple" is used herein to mean "directly or indirectly joined, linked, fastened, or connected." Besides, the elements A and B are not limited to a mechanical or physical coupling.

The terminology used herein is for the purpose of describing particular embodiments only and is not intended to be limiting of embodiments of the disclosure. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
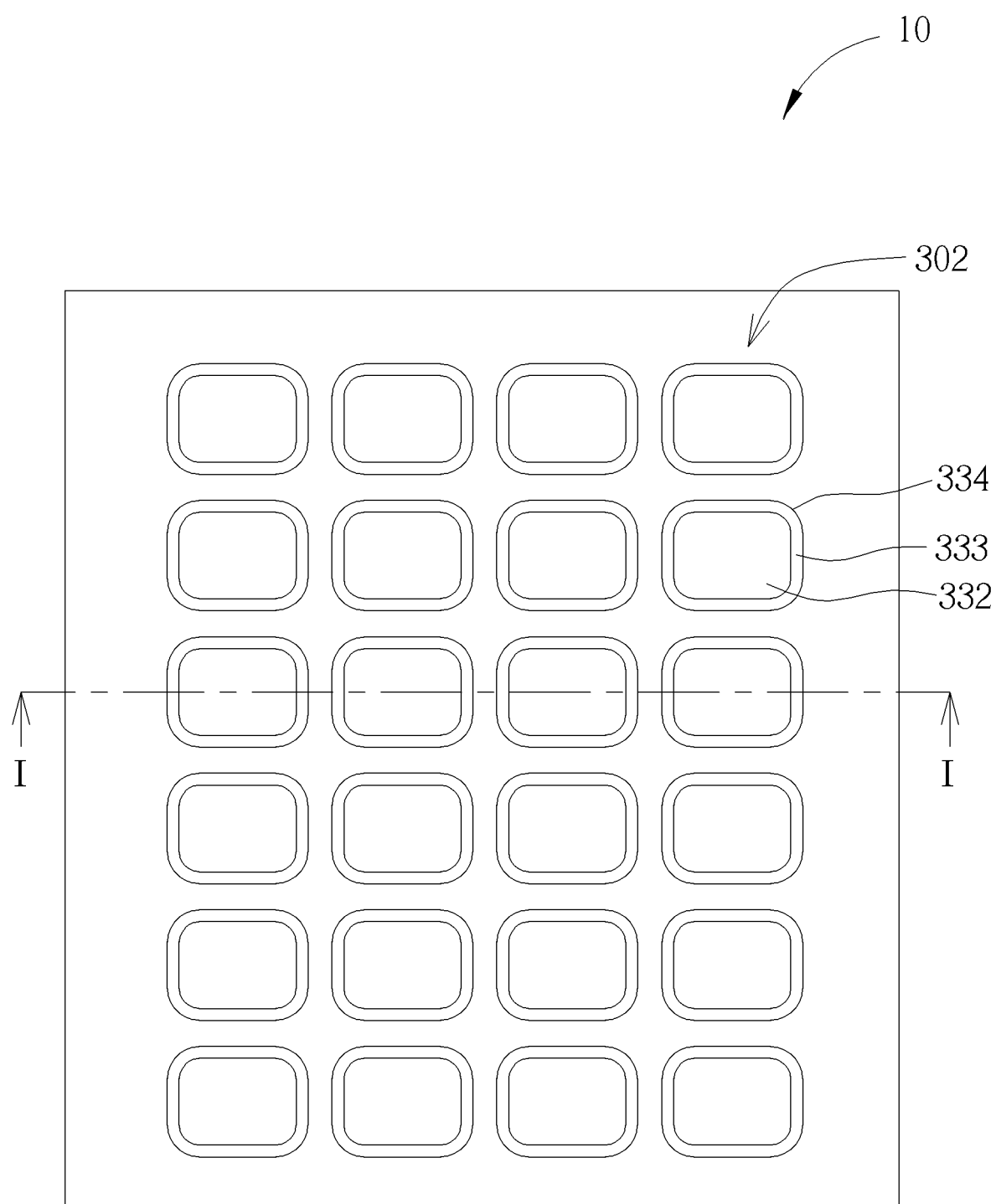
FIG. 1 illustrates a diagrammatic planar view of the first embodiment of a display assembly of the present disclosure.
Figure 2:
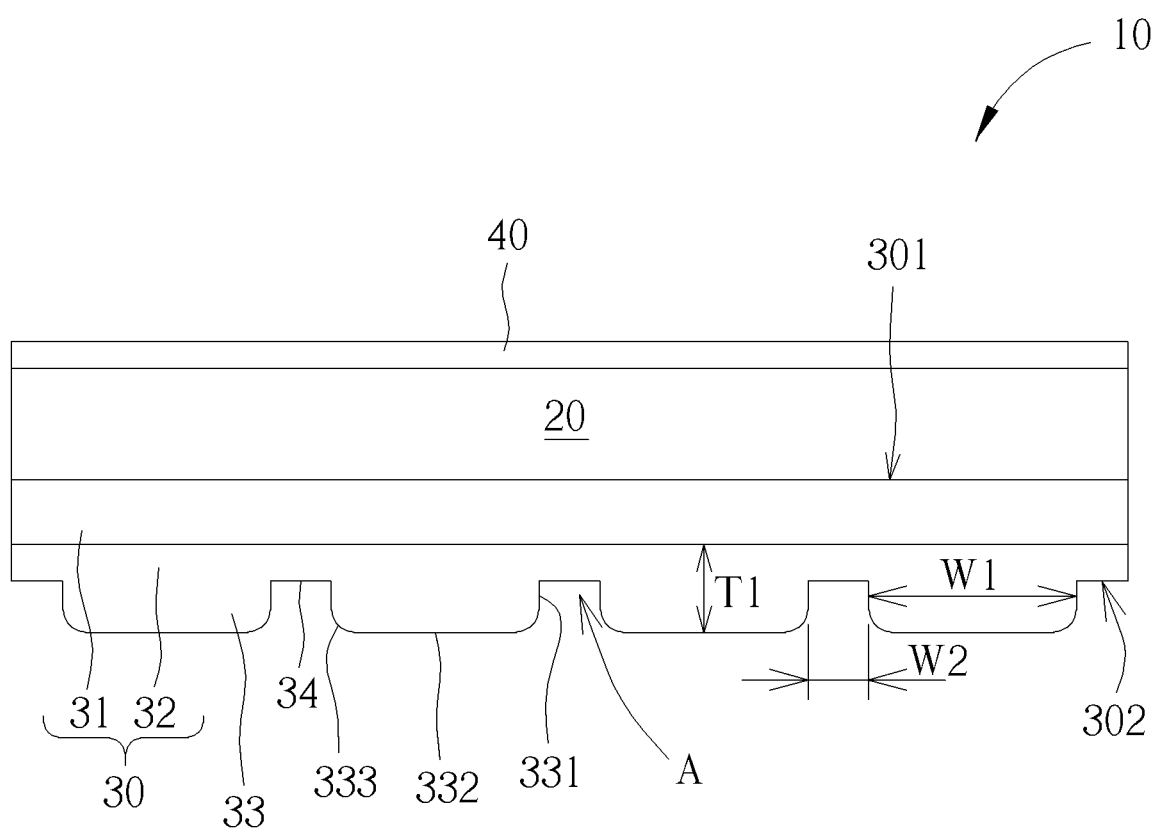
FIG. 2 is a schematic cross-section view on the line I-I of the display assembly of FIG. 1.

In the following embodiments of the present disclosure, a display assembly is first described, with reference to FIGS. 1 to 2. FIG. 1 shows a diagrammatic planar view of the first embodiment of a display assembly of the present disclosure; FIG. 2 is a schematic cross-section view on the line I-I of the display assembly of FIG. 1. As shown, reference numeral 10 denotes a display assembly. In this embodiment, the display assembly 10 includes a display component 20 and a flexible stratum 30. Optionally, the display assembly 10 includes a cover layer 40 disposed on the display component 20 to protect the display component 20 from environmental impacts. The flexible stratum 30 includes a first side 301 coupled to the display component 20 and a second side 302 opposite to the first side 301. The flexible stratum 30 includes, at the first side 301, a flexible substrate 31 coupled to the display component 20, and, at the second side 302, a supporting layer 32 formed on the flexible substrate 31. It is optional that the flexible stratum 30 of the present disclosure is constituted as a single object. The flexible substrate 31 and the supporting layer 32 in the present disclosure may include materials such as polyethylene terephthalate (PET), polyethylene naphthalate (PEN), polycarbonate (PC), polyarylate (PAR), polyether imide (PEI), polyether sulfone (PES) or polyimide (PI). In this embodiment, the material used as the flexible substrate is different from the material used as the supporting film, in which their elastic moduli are different.

As shown in FIG. 2, the supporting layer 32 at the second side 302 includes protruding portions 33 and recessed portions 34 spacing the protruding portion 33. In this embodiment, each of the protruding portions 33 has similar or the same shape. Each of the protruding portions 33 includes a side section 331 adjacent to at least one of the recessed portions 34, a top section 332, and a tapering section 333 extending from the side section 331 to the top section 332. The tapering section 333 has a curved surface connecting the top section 332 and the side section 331. In addition to the curved surface of the tapering section 333, each of the protruding portions 33 includes at least a rounded corner 334. In FIG. 1 showing a plan view of the display assembly 10, for example, the protruding portions 333 are formed in rounded rectangle including four rounded corners 334. In another embodiment, the protruding portions 333 are formed in rounded polygonal including plural rounded corners. The configuration of the curved surface of the tapering section 333 or the rounded corners 334 of the protruding portions 33 could effectively reduce friction between two adjacent protruding portions 33 or even avoid a collision when the display assembly 10 is bent. Besides, in order to provide sufficient support or flexibility to a display, the protruding portions 33 includes a thickness Ti along a direction from the first side 301 toward the second side 302, and a width W1 in a cross-sectional view; the thickness T1 is less than the width W1. In addition, the width W1 of the protruding portions 33 is greater than a width W2 of the recessed portion 34. In the first embodiment, each of the recessed portions 34 between two adjacent protruding portions 33 can define a foldable area A. A plurality of foldable areas arranged in a straight line forms a foldable axis. It should be noted that the recessed portions may indicate the spacing between two adjacent protruding portions 33 or portions of the supporting layer which are thinner than the protruding portions 33.

Figure 3:
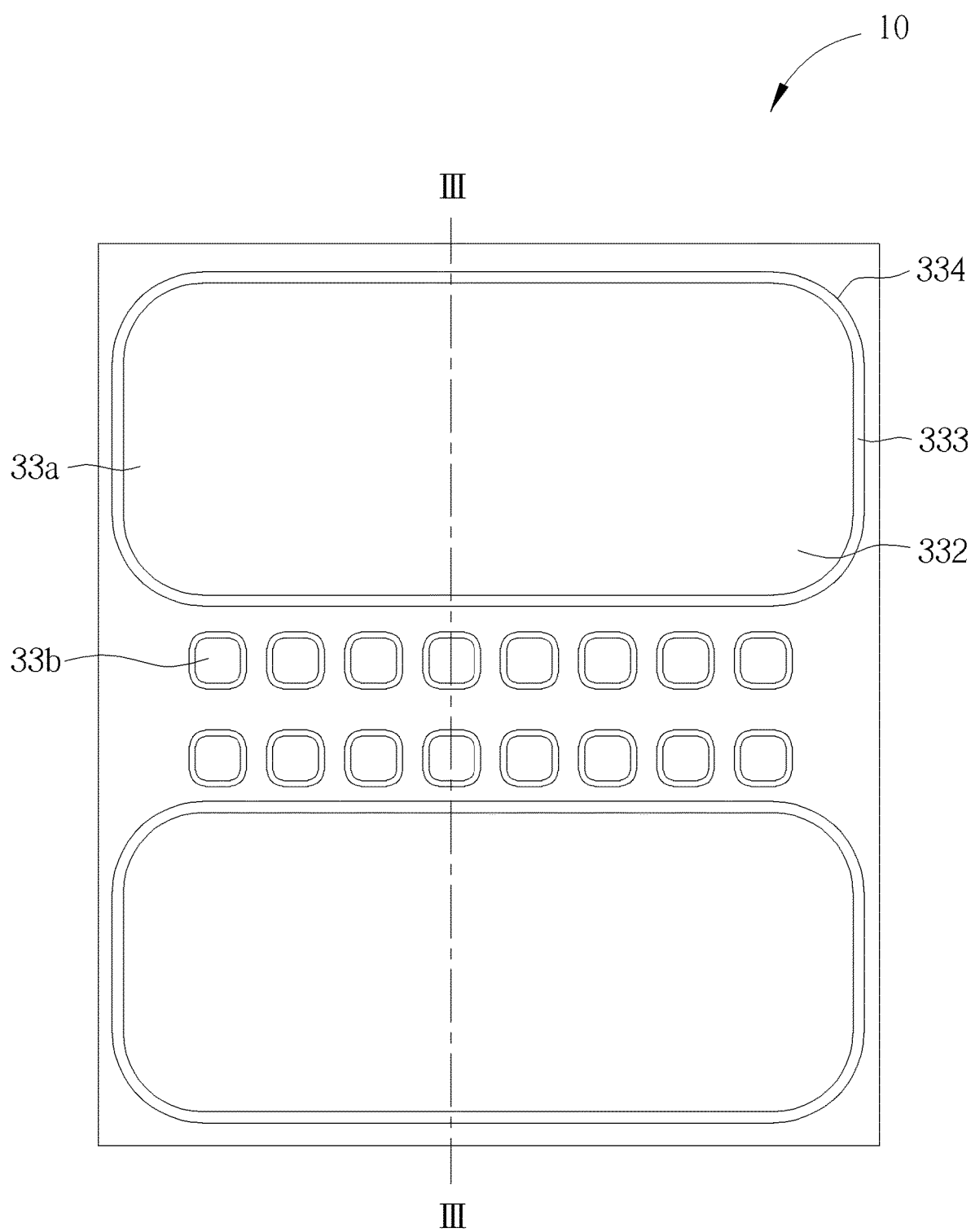
FIG. 3 illustrates a diagrammatic planar view of the second embodiment of a display assembly with different shaped protruding portions of the present disclosure.
Figure 4:
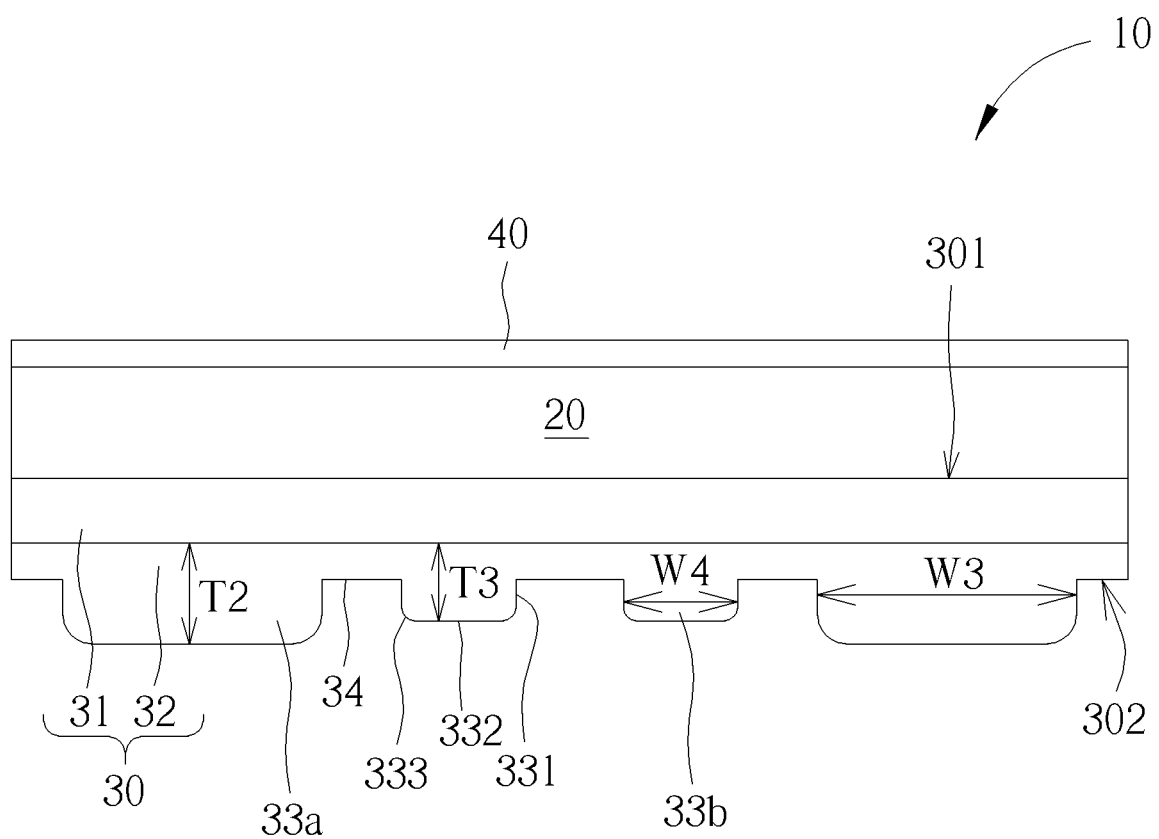
FIG. 4 is a schematic cross-section view on the line of the display assembly of FIG. 3.
Figure 5:
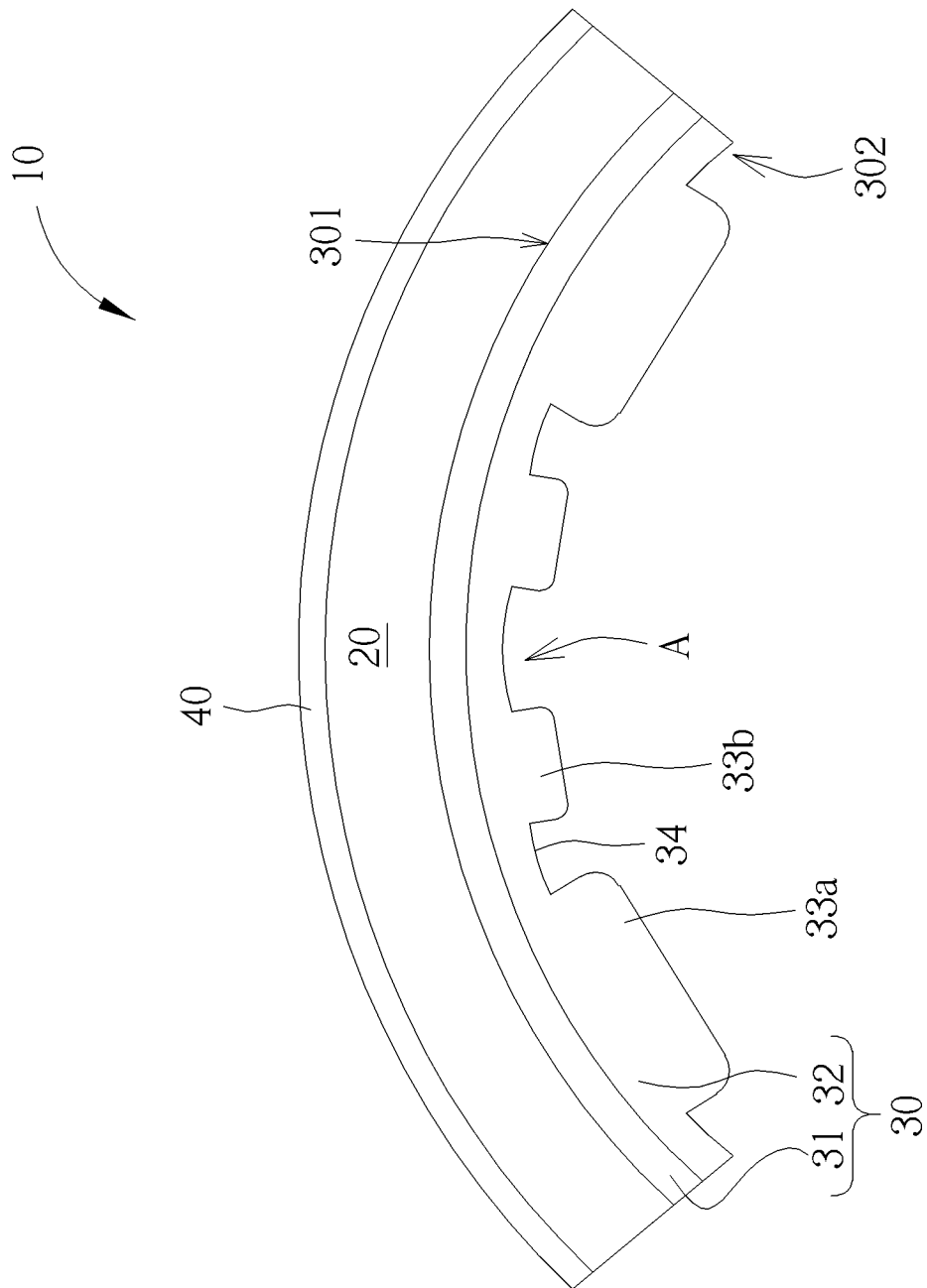
FIG. 5 is a schematic cross-section view the display assembly of FIG. 3 bent in accordance with a folding axis.

A second embodiment of a display assembly of the present disclosure, as showed in FIG. 3 through FIG. 5, provides that the protruding portions 33 of the supporting layer 32 have different shapes. In FIG. 3 showing a diagrammatic planar view of the second embodiment, exemplary, the protruding portions 33 divides into first protrusions 33a and second protrusions 33b by area. The area of each of the first protrusions 33a is different from the area of each of the second protrusions 33b. Further, the area of each of the first protrusions 33a is greater than the area of each of the second protrusions 33b. The second protrusions 33b are arranged in two parallel lines and located between two the first protrusions 33a. In the present disclosure, the shape of the protrusions could change degree of curvature of the display assembly 10. Referring to FIG. 4 showing a schematic cross-section view on the line of the display assembly 10 of FIG. 3, the first protrusion 33a has a thickness T2 along a direction from the first side 301 toward the second side 302, and the second protrusion 33b has a thickness T3 along a direction from the first side 301 toward the second side 302. The thickness T2 of the first protrusion 33a is greater than the thickness T3 of the second protrusion 33b. Additionally, in a cross-sectional view, the first protrusion 33a has a width W3, and the second protrusion 33b has a width W4; the width W3 of the first protrusion 33a is greater than the width W4 of the second protrusion 33b. It is clear that the second protrusion 33b has a smaller thickness T3 and width W4 than the first protrusions 33a. As shown in FIG. 5, the foldable area A of the recessed portions 34 between two adjacent second protrusions 33b has greater bending capability. In addition, since both the first protrusions 33a and the second protrusions 33b have curved surfaces on the taper section 333 and rounded corners 334, as described in the first embodiment, the thinner and narrower second protrusions 33b accompanying with the curved surface of the tapering section 333 and the rounded corners 334 could more effectively reduce friction between two adjacent protruding portions 33 or even avoid a collision when the display assembly 10 is bent.

Figure 6:
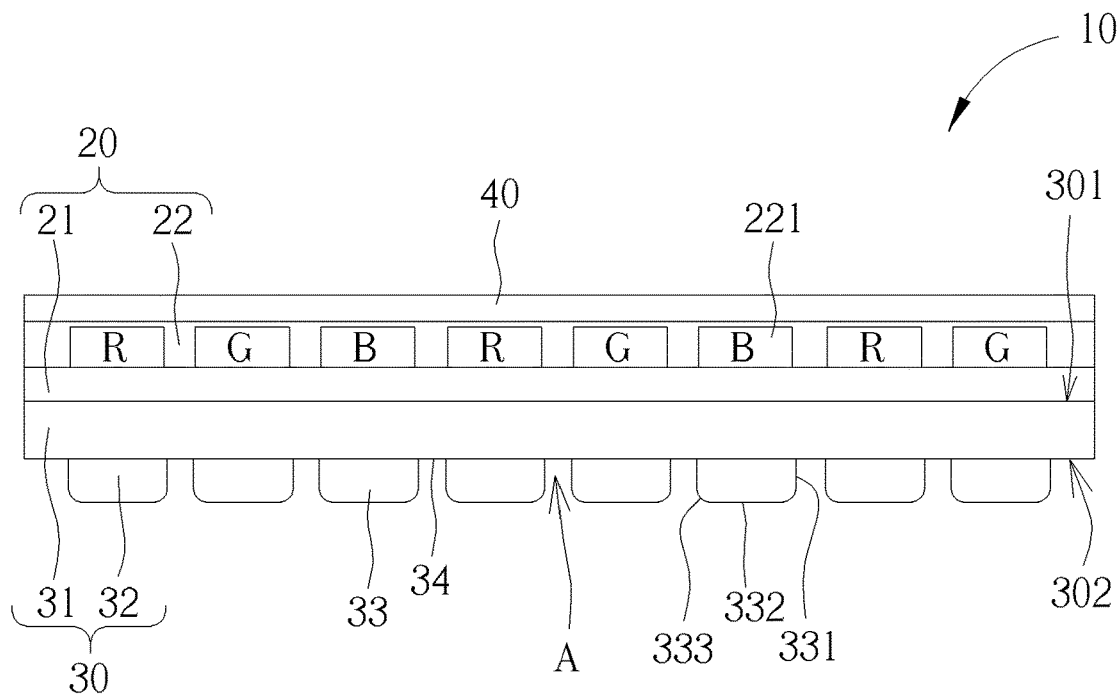
FIG. 6 illustrates a schematic sectional view of a display assembly having a plurality of light emitting units in accordance with the third embodiment of the present disclosure.
Figure 7:
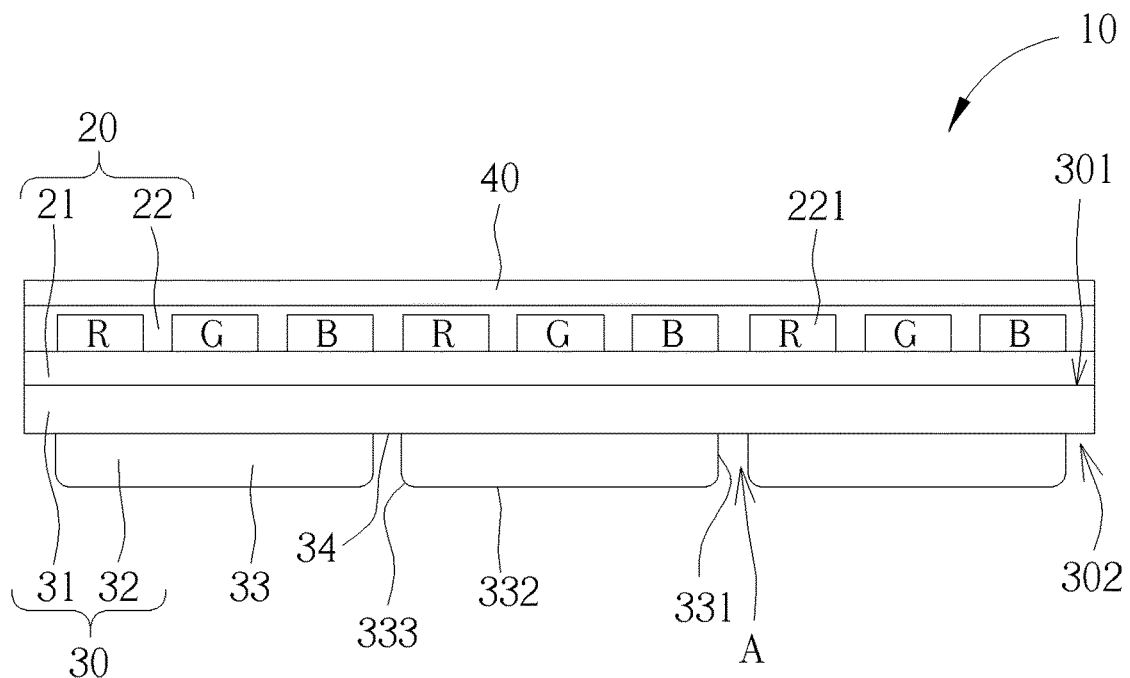
FIG. 7 illustrates a schematic sectional view of a display assembly having a plurality of light emitting units in accordance with the fourth embodiment of the present disclosure.
Figure 8:
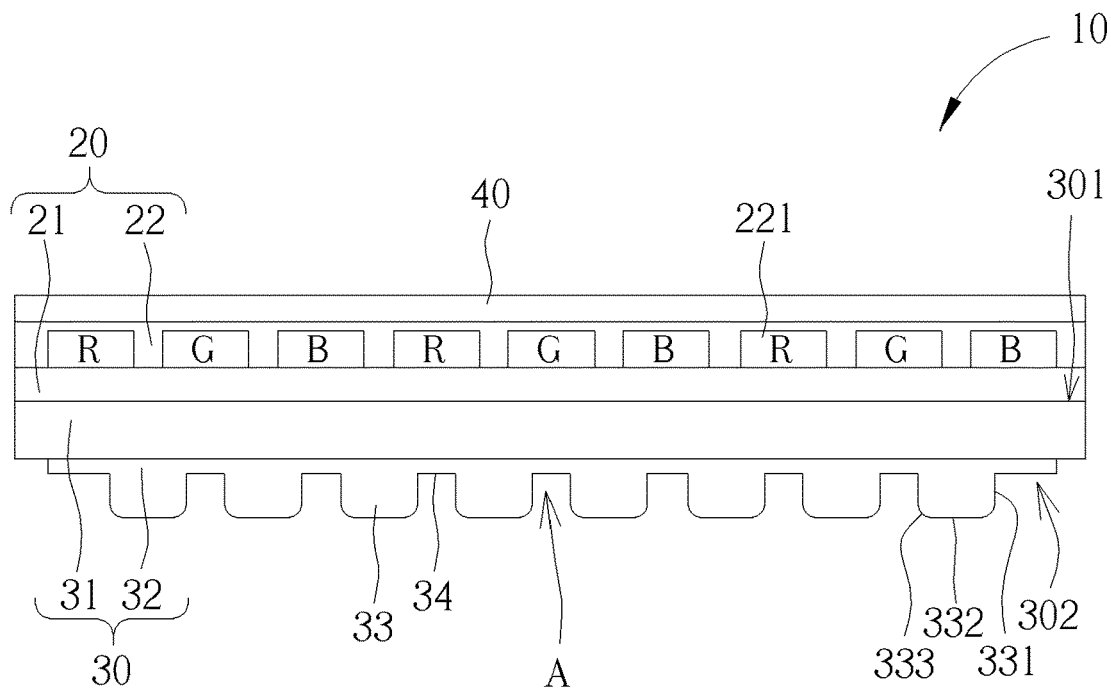
FIG. 8 illustrates a schematic sectional view of a display assembly having a plurality of light emitting units in accordance with the fifth embodiment of the present disclosure.

FIG. 6 shows a schematic sectional view of a display assembly in accordance with a third embodiment of the present disclosure. The display assembly 10 includes a cover layer 40, a flexible stratum 30 and a display component 20 disposed between the cover layer 40 and the flexible stratum 30. The display component 20 further includes a driving circuit layer 21 and a display layer 22 electrically connected to the driving circuit layer 21. The flexible stratum 30 includes a first side 301 coupled to the display component 20 and a second side 302 opposite to the first side 301. The flexible stratum 30 includes, at the first side 301, a flexible substrate 31 coupled to the display component 20, and, at the second side 302, a supporting layer 32 formed on the flexible substrate 31. In this embodiment, the display layer 22 includes a plurality of light emitting units 221. The light emitting units 221 is used to provide illumination. In this embodiment, the light emitting units 221 is light emitting diodes with the same color or different colors. In FIG. 6, one of the protruding portions 33 is disposed corresponding to one of the plurality of light emitting units 221. In FIG. 7, showing a schematic sectional view of a display assembly of a fourth embodiment of the present disclosure, one of the protruding portions 33 is disposed correspondingly to three of the plurality of light emitting units 221. The three of the plurality of light emitting units 221 can provide illumination with the same color or with different colors, i.e. red, green and blue, to compose a pixel unit. In the aforementioned embodiments, as disposed correspondingly to a single light emitting unit 221 or a pixel unit, the protruding portions 33 is capable of providing structural strength as well as maintaining optical performance of the single light emitting unit 221 or the pixel unit. In FIG. 8, on the other hand, the plurality of light emitting units 221 is disposed correspondingly to the recessed portions 34, so as to provide more flexibility to the display assembly 10.

Figure 9:
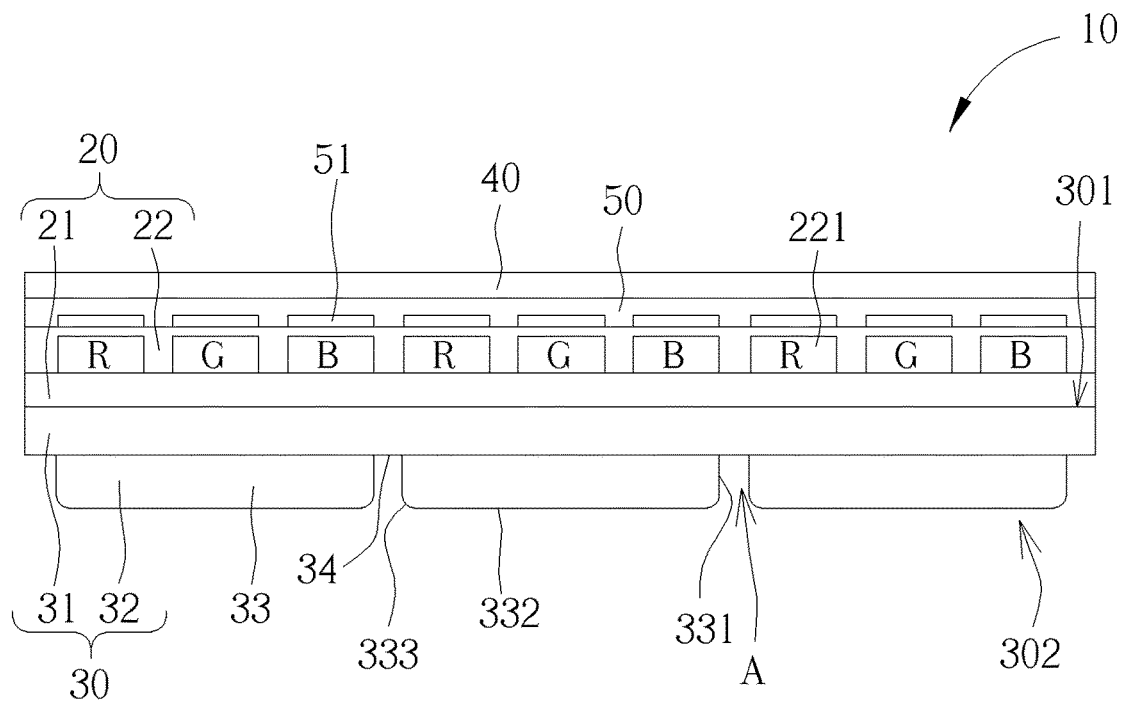
FIG. 9 illustrates a schematic sectional view of a display assembly having a plurality of light emitting units in accordance with the sixth embodiment of the present disclosure.
Figure 10:
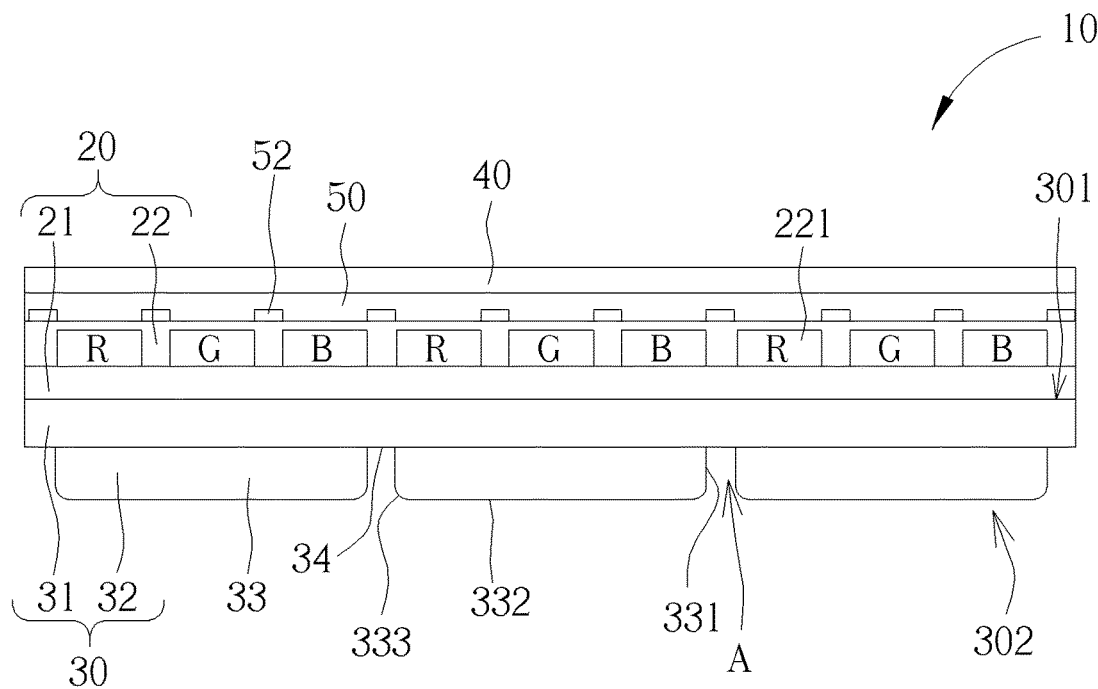
FIG. 10 illustrates a schematic sectional view of a display assembly having a plurality of light emitting units in accordance with the seventh embodiment of the present disclosure.

Referring to the embodiments in FIGS. 9 and 10, the present disclosure can apply in touchscreen technologies. In FIG. 9, showing a schematic sectional view of a display assembly 10 in accordance with a sixth embodiment of the present disclosure. The display assembly 10 further includes a touch sensing layer 50 disposed between the cover layer 40 and the display component 20. The touch sensing layer 50 includes transparent conducting electrodes 51, such as ITO electrodes, formed in a grid pattern, which allow transmitting light emitted from the light emitting units 221. In this embodiment, the transparent conducting electrodes 51 are disposed correspondingly to the plurality of light emitting units 221. As to the seventh embodiment in FIG. 10, the touch sensing layer 50 further includes opaque conducting electrodes 52, such as aluminum or copper metal electrodes, formed in a grid pattern. The opaque conducting electrodes 52 block light transmitting from the plurality of light emitting units 221 and are disposed correspondingly to locations between adjacent two of the light emitting units. Thus, light emitted from the light emitting units 221 can only transmit through between adjacent two of the opaque conducting electrodes 52. The illuminating performance of the display assembly 10 would not be influenced by adding the touch sensing layer 50. In addition to the embodiments in FIGS. 9 and 10, for applying to in-cell touch technology, the touch sensing layer 50 could be integrated with the display layer 22 or the driving circuit layer 21.

Figure 11:
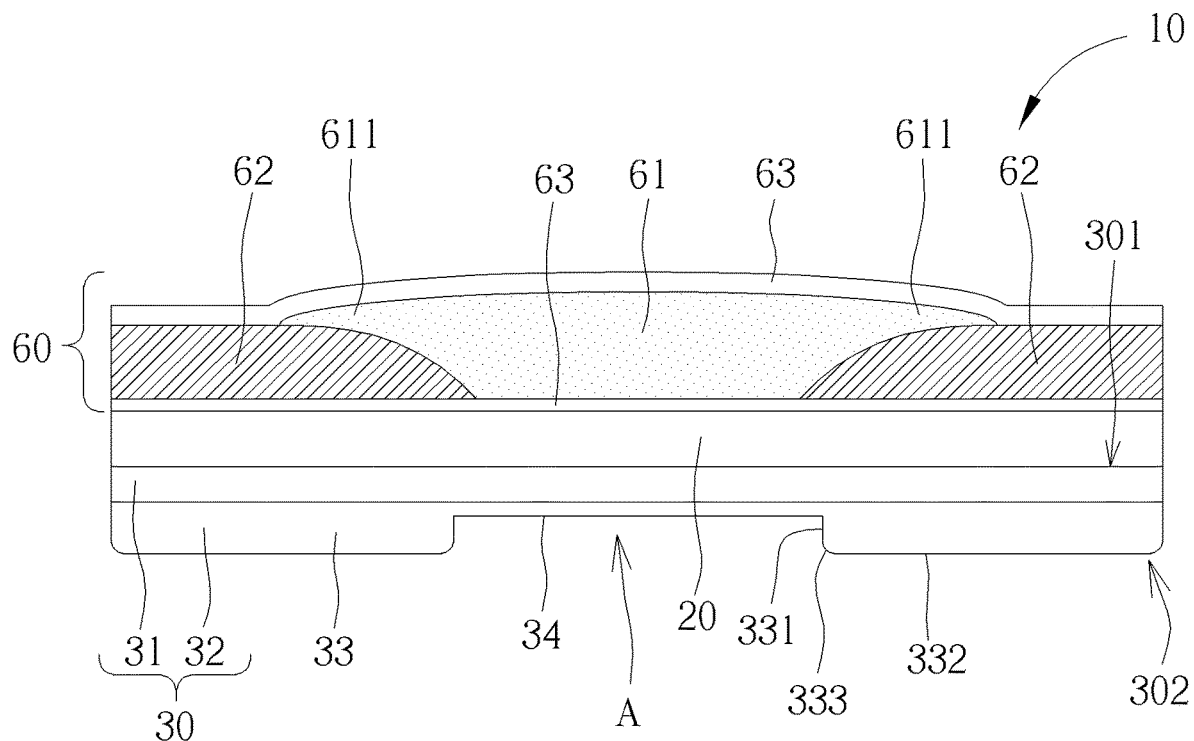
FIG. 11 illustrates a schematic sectional view of a display assembly apply OLED technology in accordance with the eighth embodiment of the present disclosure.
Figure 12:
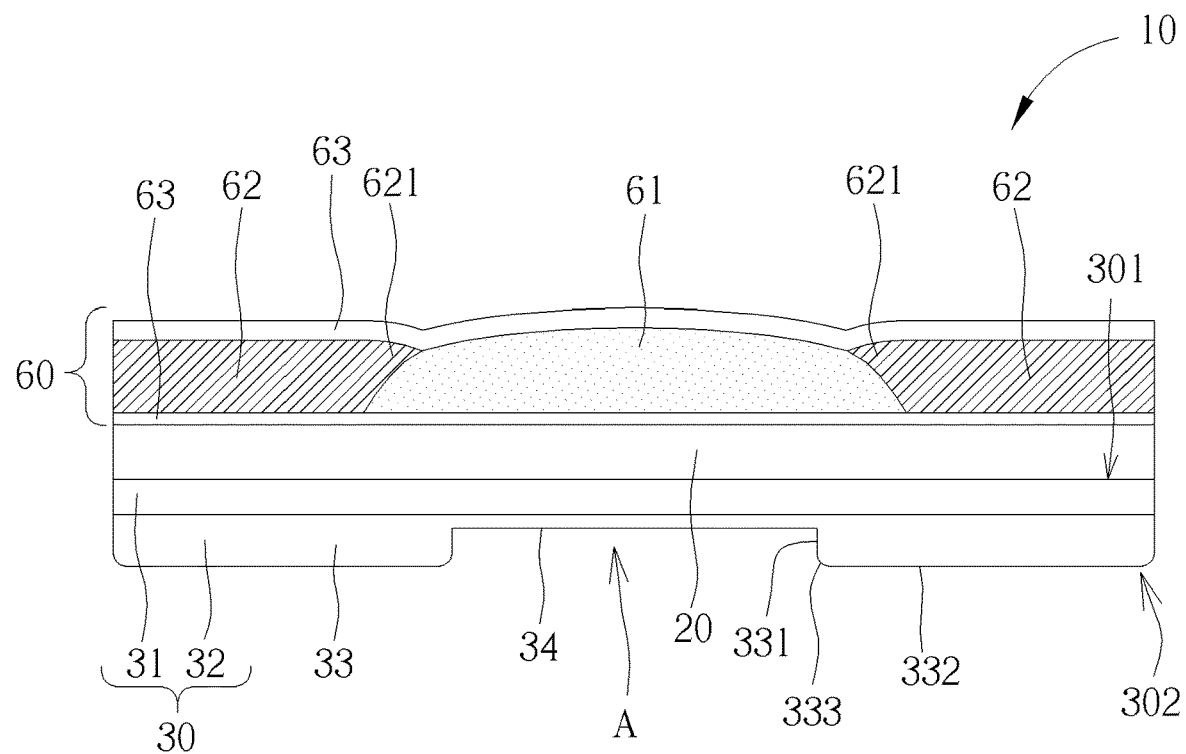
FIG. 12 illustrates a schematic sectional view of a display assembly apply OLED technology in accordance with the ninth embodiment of the present disclosure.

FIGS. 11 and 12 respectively show embodiments that the present disclosure applies OLED technology. In FIG. 11, the display assembly 10 further comprises an encapsulating layer 60 disposed on the display component 20. The encapsulating layer 60 includes a first organic layer 61 with a first elastic modulus and a second organic layer 62 with a second elastic modulus. The encapsulating layer 62 includes two inorganic insulating layers 63. In addition, the first organic layer 61 is disposed correspondingly to locations between adjacent two of the protruding portions 33, i.e. the first organic layer 61 is disposed corresponding to one of the recessed portions 34.

The first elastic modulus of the first organic layer 61 is less than the second elastic modulus of the second organic layer 62. In this embodiment, the first organic layer 61 has the first elastic modulus within a range of about 0.001 to 0.05 Gpa inclusive, and the second organic layer 62 has the second elastic modulus within a range of about 2 to 20 Gpa inclusive. However, the first elastic modulus and the second elastic modulus are not limited to the above ranges. The first organic layer 61 and the second organic layer 62 are sandwiched between the two inorganic insulating layers 63. The first elastic modulus and the second elastic modulus are Young's modulus, which is a measure of a solid material's resistance to being deformed elastically when a force is applied to it. A higher value of elastic modulus represents that the material is more rigid. That is, in this instance, the first organic layer 61 is more flexible than the second organic layer 62. The first organic layer 61 includes a silicon-based resin, and the second layer includes an acryl-based resin or an epoxy-based resin. As described above, a foldable area A is defined in a recessed portion 34 between two adjacent protruding portions 33. Accordingly, when a force applies to the foldable area A of the display assembly 10, the first organic layer 61 with higher flexibility can facilitate its bending performance.

Furthermore, to avoid disengaging or separating the first organic layer 61 and the second organic layer 62, in this embodiment, a part of the first organic layer 61 overlaps a part of the second organic layer 62. In FIG. 11, the first organic layer 61 includes at least an extending portion 611 extending toward the second organic layer 62 and covering a part of the second organic layer 62. In the embodiment of FIG. 12, the second organic layer 62 includes at least an extending portion 621 extending toward the first organic layer 61 and covering a part of the first organic layer 61. As to these embodiments, the first organic layer 61 and the second organic layer 62 have a greater contacting surface, and therefore the adhesion of first organic layer 61 and the second organic layer 62 is increased.

Figure 13:
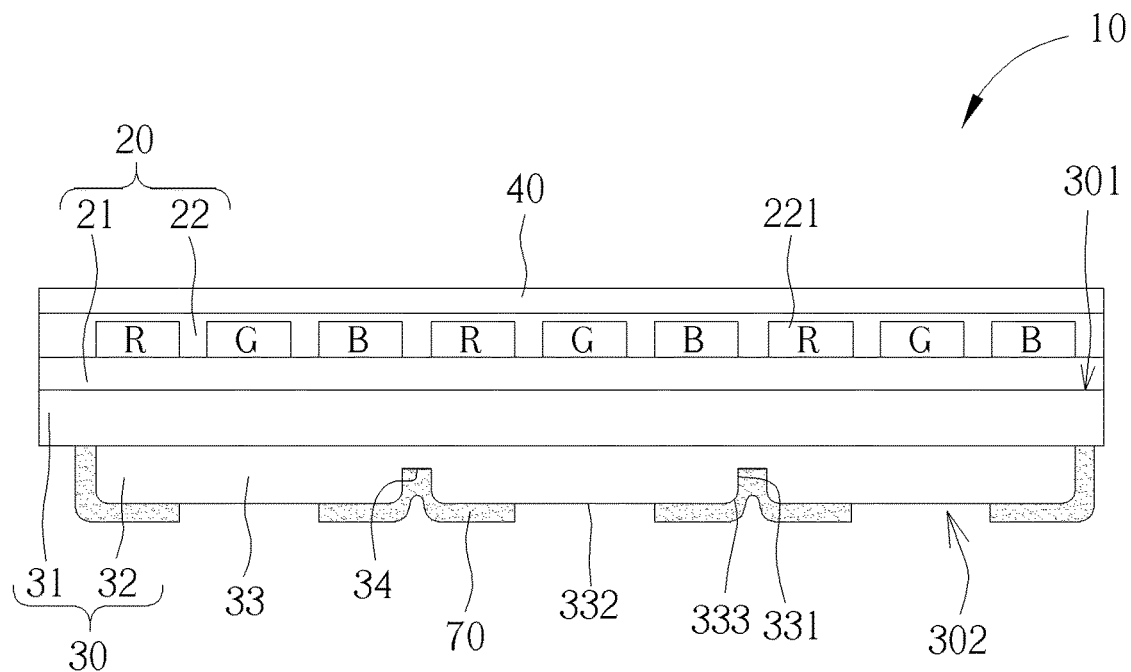
FIG. 13 illustrates a schematic sectional view of a display assembly having a protection layer in accordance with the tenth embodiment of the present disclosure.

FIG. 13 shows a schematic sectional view of a display assembly in accordance with a tenth embodiment of the present disclosure. In order to protect the flexible stratum 30, the display assembly 10 further includes a protection layer 70 disposed on the second side 302 of the flexible stratum 30. The protection layer 70 at least covers locations between adjacent two of the protruding portions 33, and the side sections 331 and the tapering sections 333 of the protruding portions 33. Optionally, the protection layer 70 may cover the whole area of the second side 302 of the flexible stratum 30, i.e. all of the protruding portions 33 and the recessed portions 34. The protection layer 70 includes a photocurable resin or a photoresist resin. It is, thus, apparent that the configuration of the protection layer 70 further provides the flexible stratum 30 and the display component 20 sufficient support and maintain their effective working performance.

While the foregoing disclosure shows illustrative embodiments of the disclosure, it should be noted that various changes and modifications could be made herein without departing from the scope of the disclosure as defined by the appended claims. The functions, steps and/or actions of the method claims in accordance with the embodiments of the disclosure described herein need not be performed in any particular order. Furthermore, although elements of the disclosure may be described or claimed in the singular, the plural is contemplated unless limitation to the singular is explicitly stated.

What is claimed is:

1. A flexible electronic assembly, comprising:
   an electronic component;
   a flexible substrate including a first surface coupled to the electronic component and a second surface opposite to the first surface; and
   a supporting layer coupled to the second surface, the supporting layer including a plurality of protrusions,
   wherein, in a plan view of the flexible electronic assembly, one of the plurality of protrusions includes at least a rounded corner.

2. The flexible electronic assembly of claim 1, wherein the supporting layer includes a plurality of recessed portions, and one of the plurality of recessed portions spaces two adjacent protrusions of the plurality of protrusions.

3. The flexible electronic assembly of claim 1, wherein the supporting layer includes a combination of a plurality of first protrusions and a plurality of second protrusions disposed between the plurality of first protrusions, and a number of the plurality of second protrusions is greater than a number of the plurality of first protrusions.

4. The flexible electronic assembly of claim 3, wherein, in a cross-sectional view of the flexible electronic assembly, one of the plurality of first protrusions has a first width, one of the plurality of second protrusions has a second width, and the first width is greater than the second width.

5. The flexible electronic assembly of claim 4, wherein the supporting layer includes a recessed portion spacing the one of the plurality of first protrusions and the one of the plurality of second protrusions, in the cross-sectional view of the flexible electronic assembly, the recessed portion has a third width, and the first width is greater than the third width.

6. The flexible electronic assembly of claim 1, further comprising a cover layer disposed on the electronic component, wherein the electronic component is disposed between the cover layer and the flexible substrate.

7. The flexible electronic assembly of claim 1, wherein the flexible electronic assembly comprises a light blocking element and the electronic component comprises a plurality of light emitting units, and the light blocking element is disposed between two adjacent light emitting units of the plurality of light emitting units.

8. The flexible electronic assembly of claim 1, wherein the electronic component provides illumination.

\* \* \* \* \*